US010964796B2

(12) United States Patent
Stamper et al.

(10) Patent No.: US 10,964,796 B2
(45) Date of Patent: Mar. 30, 2021

(54) HETEROJUNCTION BIPOLAR TRANSISTORS WITH STRESS MATERIAL FOR IMPROVED MOBILITY

(71) Applicant: GLOBALFOUNDRIES U.S. Inc., Santa Clara, CA (US)

(72) Inventors: Anthony K. Stamper, Burlington, VT (US); Vibhor Jain, Essex Junction, VT (US); Renata A. Camillo-Castillo, Williston, VT (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 370 days.

(21) Appl. No.: 15/427,182

(22) Filed: Feb. 8, 2017

(65) Prior Publication Data
US 2018/0226347 A1    Aug. 9, 2018

(51) Int. Cl.
| | |
|---|---|
| *H01L 29/08* | (2006.01) |
| *H01L 29/06* | (2006.01) |
| *H01L 29/66* | (2006.01) |
| *H01L 29/10* | (2006.01) |
| *H01L 29/737* | (2006.01) |
| *H01L 21/762* | (2006.01) |
| *H01L 29/732* | (2006.01) |

(52) U.S. Cl.
CPC ...... *H01L 29/66242* (2013.01); *H01L 21/762* (2013.01); *H01L 21/76224* (2013.01); *H01L 29/0603* (2013.01); *H01L 29/0649* (2013.01); *H01L 29/0821* (2013.01); *H01L 29/1004* (2013.01); *H01L 29/66272* (2013.01); *H01L 29/7371* (2013.01); *H01L 29/732* (2013.01)

(58) Field of Classification Search
CPC ................................................. H01L 29/66242
See application file for complete search history.

(56) References Cited

U.S. PATENT DOCUMENTS

| | | | |
|---|---|---|---|
| 7,102,205 B2 * | 9/2006 | Chidambarrao | H01L 29/66242 257/565 |
| 7,262,484 B2 | 8/2007 | Dunn et al. | |
| 7,314,802 B2 * | 1/2008 | Zhu | H01L 29/4908 257/E29.151 |
| 7,329,941 B2 | 2/2008 | Chidambarrao et al. | |
| 7,786,510 B2 | 8/2010 | Shim et al. | |

(Continued)

OTHER PUBLICATIONS

A. Kumar et al., "A Simple Unified 3D Stress Model for Device Design in Stress-Enhanced Mobility Technologies", Conference Paper Sep. 2012, pp. 1-5.

(Continued)

*Primary Examiner* — Steven B Gauthier
*Assistant Examiner* — Christopher A Culbert
(74) *Attorney, Agent, or Firm* — Gibb & Riley, LLC; Michael J. LeStranqe, Esq.

(57) ABSTRACT

According to a semiconductor device herein, the device includes a substrate. An active device is formed in the substrate. The active device includes a collector region, a base region formed on the collector region, and an emitter region formed on the base region. An isolation structure is formed in the substrate around the active device. A trench filled with a compressive material is formed in the substrate and positioned laterally adjacent to the emitter region and base region. The trench extends at least partially into the base region.

19 Claims, 16 Drawing Sheets

(56) References Cited

U.S. PATENT DOCUMENTS

| | | | |
|---|---|---|---|
| 8,361,847 B2 | 1/2013 | Johnson et al. | |
| 8,853,746 B2* | 10/2014 | Chen .................... | H01L 29/161 257/19 |
| 9,059,138 B2 | 6/2015 | Camllo-Castillo et al. | |
| 2003/0102498 A1* | 6/2003 | Braithwaite ........ | H01L 27/0617 257/288 |
| 2008/0029809 A1* | 2/2008 | Morioka ........... | H01L 29/66666 257/329 |
| 2008/0116488 A1 | 5/2008 | Shim et al. | |
| 2008/0227262 A1* | 9/2008 | El-Kareh ............ | H01L 21/8249 438/343 |
| 2011/0073910 A1 | 3/2011 | Takizawa et al. | |
| 2011/0221063 A1 | 9/2011 | Ichinose et al. | |

OTHER PUBLICATIONS

Taiwanese Application No. 106128587, Notice of Allowance dated Jun. 17, 2019, pp. 1-3.
Taiwanese Application No. 106128587, Examination Report dated Feb. 23, 2019 pp. 1-7 and Search Report dated Feb. 22, 2019 pp. 1-10.
Chinese Application No. 201711291721.2, Search Report dated Aug. 28, 2020, pp. 1-2.

\* cited by examiner

Asymetric trench

Symmetric trench

HETEROJUNCTION BIPOLAR TRANSISTORS WITH STRESS MATERIAL FOR IMPROVED MOBILITY

BACKGROUND

The present disclosure relates generally to integrated circuit device structures, and more specifically, to device structures having stress material in trenches for improved mobility.

Silicon Germanium (SiGe) heterojunction bipolar transistors (HBTs) have been widely used in high speed and high frequency applications. For a typical bipolar junction transistor (BJT), the collector junction that is located at the bottom of the sandwich layers has more current flow compared with the base in the center layer and the emitter in the top layer.

Power amplifiers (PAs), low-noise amplifiers (LNAs), and switches, such as those used in radio frequency (RF) applications, typically incorporate bipolar junction transistors (BJTs) and, particularly, high performance heterojunction bipolar transistors (HBTs). Design modifications to increase the unity short circuit current gain frequency ($f_T$) (i.e., the switching speed) of such transistors can result in corresponding increases in the linearity and gain of the amplifiers. Those skilled in the art will recognize that $f_T$ is a function of the device parasitics, including parasitic resistances and parasitic capacitances. For example, the $f_T$ of a BJT or HBT can be increased by decreasing the base-emitter capacitance ($C_{be}$) and/or decreasing the emitter resistance ($R_e$) and, as a result, the linearity and gain of amplifiers that incorporate such BJTs or HBTs can be increased. $C_{be}$ is often decreased by increasing the separation distance between the base and emitter. Unfortunately, this technique results in a corresponding increase in emitter resistance ($R_e$), which decreases the $f_T$. If the size and, particularly, the width of the BJT or HBT is then increased to lower $R_e$ and increase the $f_T$, a corresponding increase in $C_{be}$ will occur. Thus, it would be advantageous to provide a method of forming a transistor structure (e.g., a BJT or HBT structure), which allows for a higher gain frequency ($f_T/f_{max}$) with lower parasitics, such as base-emitter capacitance ($C_{be}$), collector-base capacitance ($C_{cb}$), and base resistance ($R_b$).

SUMMARY

Stress effects can be utilized to improve carrier mobility in the base and collector for lower base resistance ($R_b$) and higher gain frequency ($f_T/f_{max}$). A trench adjacent to the HBT, which is filled with compressive material, can be used to improve carrier mobility in the base and collector region. Carrier mobility refers to how quickly a charge carrier can move through a metal or semiconductor, when pulled by an electric field. In general, the term carrier mobility refers to both electron and hole mobility in semiconductors. Improved carrier mobility improves $f_T$ and reduces $R_b$. Additionally, reducing base resistance ($R_b$) can improve $f_{max}$ and gain. In view of the foregoing, disclosed herein are embodiments of a transistor (e.g., a bipolar junction transistor (BJT) or a heterojunction bipolar transistor (HBT)), which incorporates compressive material to improve carrier mobility in the base and collector region. The compressive material may be formed by layers of titanium (Ti) and aluminum (Al) films, which are deposited in a tensile condition in a trench around the emitter, and become compressive with reaction of Ti—Al forming $TiAl_3$. In some embodiments, a film of titanium nitride (TiN) or other compressive materials may be used, which are compressive as deposited and stay compressive.

According to a semiconductor device herein, the device includes a substrate. An active device is formed in the substrate. The active device is a NPN transistor consisting of a collector region, a base region formed on the collector region, and an emitter region formed on the base region. An isolation structure is formed in the substrate around the active device. A trench filled with a compressive material is formed in the substrate and positioned laterally adjacent to the emitter region and base region. The trench extends at least partially into the base region.

According to a structure herein, a heterojunction bipolar transistor structure includes an emitter, a base having an extrinsic base and an intrinsic base, and a collector. In some embodiments, the base of the heterojunction bipolar transistor contains SiGe. A shallow trench isolation (STI) structure is formed around the emitter, base, and collector. A trench is positioned laterally adjacent to the emitter and base. The trench extends at least partially into the base. A compressive material fills the trench, and improves carrier mobility in the base and collector. The heterojunction bipolar transistor is an NPN type transistor.

According to a method herein, an active device is formed on a silicon substrate. The active device is an NPN transistor that includes a collector region, a base region formed on the collector region, and an emitter region formed on the base region. An isolation structure is formed in the silicon substrate around the NPN transistor. The isolation structure contains a dielectric. A trench is formed in the silicon substrate and positioned laterally adjacent the NPN transistor. The trench is formed at least partially into the base region. The trench is filled with compressive material to improve carrier mobility in the base and collector region.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
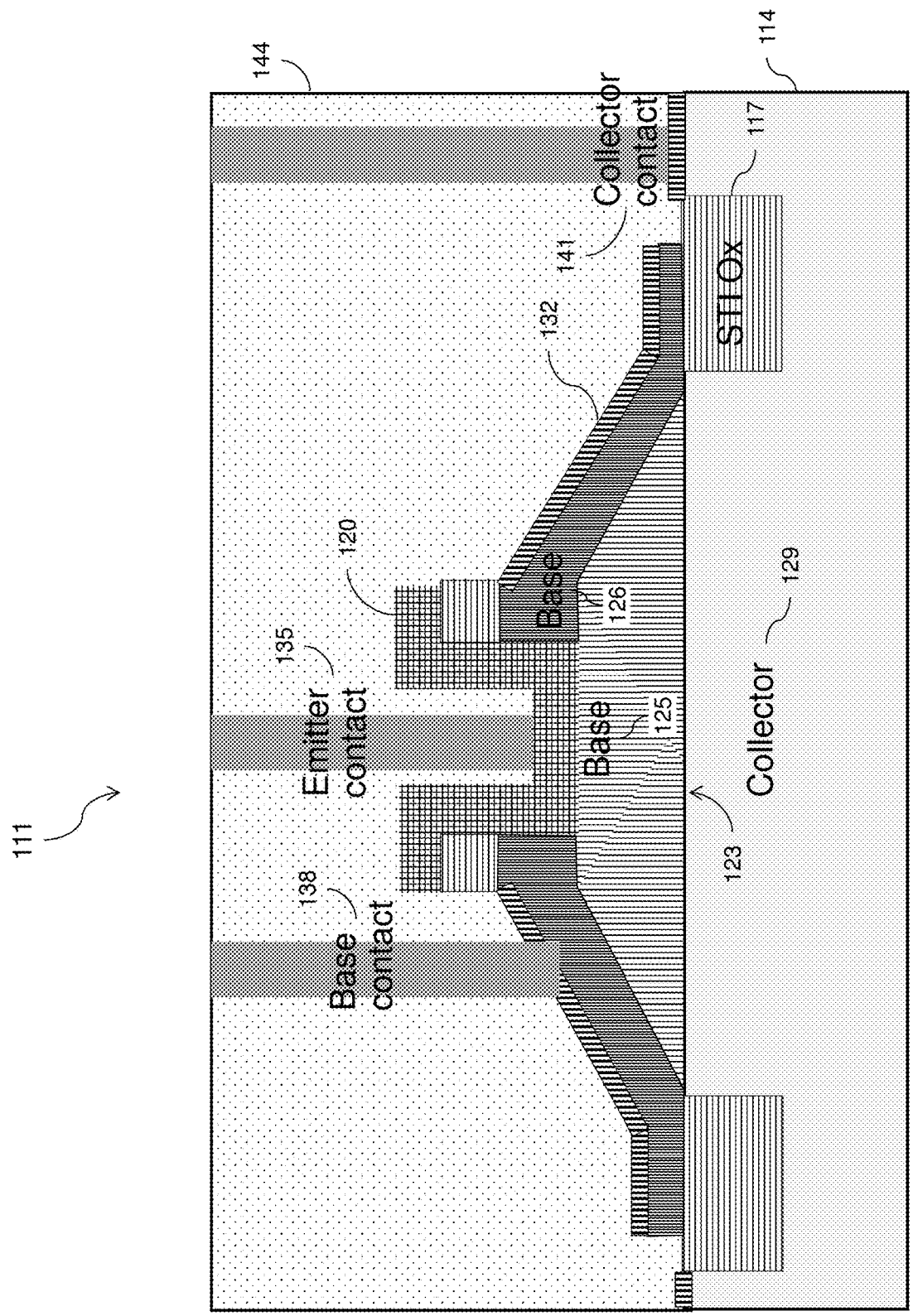
FIGS. 1-6 are cross-section diagrams illustrating a partially completed IC structure formed according to devices and methods herein.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

As mentioned above, power amplifiers (PAs), low-noise amplifiers (LNAs), and switches, such as those used in radio frequency (RF) applications, typically incorporate bipolar junction transistors (BJTs) and, particularly, high performance heterojunction bipolar transistors (HBTs). Design modifications to increase the unity short circuit current gain frequency ($f_T$) (i.e., the switching speed) of such transistors can result in corresponding increases in the linearity and gain of the amplifiers. Those skilled in the art will recognize that $f_T$ is a function of the device parasitics, including parasitic resistances and parasitic capacitances. For example, the $f_T$ of a BJT or HBT can be increased by decreasing the base-emitter capacitance ($C_{be}$) and/or decreasing the emitter resistance ($R_e$) and, as a result, the linearity and gain of amplifiers that incorporate such BJTs or HBTs can be improved. $C_{be}$ is often decreased by increasing the separation distance between the base and emitter. Unfortunately, this technique results in a corresponding increase in emitter resistance ($R_e$), which decreases the $f_T$. If the size and, particularly, the width of the BJT or HBT is then increased to lower $R_e$ and increase the $f_T$, a corresponding increase in $C_{be}$ will occur. Thus, it would be advantageous to provide a method of forming a transistor structure (e.g., a BJT or HBT structure), which allows for a higher gain frequency ($f_T/f_{max}$) with lower parasitics, such as base-emitter capacitance ($C_{be}$), collector-base capacitance ($C_{cb}$), and base resistance ($R_b$).

In view of the foregoing, disclosed herein are embodiments of a transistor (e.g., a bipolar junction transistor (BJT) or a heterojunction bipolar transistor (HBT)), which incorporates compressive material to improve carrier mobility in the base and collector region. The compressive material may be formed by layers of titanium (Ti) and aluminum (Al) films, which are deposited in a tensile condition in a trench around the emitter, and become compressive with reaction of Ti—Al forming TiAl3. In some embodiments, a compressive film, such as titanium nitride (TiN), may be used, which stays compressive. In embodiments, the TiN can be much thinner film than TiAl3.

Referring to the drawings, FIG. 1 shows a heterojunction bipolar transistor (HBT), indicated generally as 111. The HBT 111 may be formed on a substrate 114 with an isolation structure 117 formed in the substrate 114. The isolation structure 117 should contain a dielectric. In some cases, the isolation structure 117 can be a shallow trench isolation (STI), as would be known by one of ordinary skill in the art. The substrate 114 may be any conventional semiconductor substrate such as, for example, a bulk silicon substrate or an active layer of semiconductor material of a silicon-on-insulator (SOI) wafer. Each embodiment of the HBT 111 can include a substrate 114, which can be a semiconductor substrate (e.g., a monocrystalline silicon substrate or a monocrystalline substrate of any other suitable semiconductor material). The substrate 114 can, for example, be doped with a first type dopant (e.g., a P-type dopant, such as boron or any other suitable P-type dopant as discussed in greater detail below) such that it has a first type conductivity (e.g., P-type conductivity) at a relatively low conductivity level (e.g., such that the substrate 114 is a P-substrate). For illustration purposes, the substrate 114 is shown in the figures as a bulk semiconductor substrate. However, it should be understood that the substrate 114 could, alternatively, be a monocrystalline semiconductor layer of a semiconductor-on-insulator (SOI) wafer.

The isolation structure 117 may be a conventional shallow trench isolation (STI) structure formed using conventional semiconductor fabrication processes and materials. For example, the isolation structure 117 may be formed by forming a photoresist material on the substrate 114, exposing and developing the photoresist, etching a relatively shallow trench in the substrate through the patterned photoresist, stripping the photoresist, filling the relatively shallow trench with a dielectric material (e.g., $SiO_2$), and planarizing the top surface of the structure (e.g., via chemical mechanical polish (CMP)). That is, the isolation structure 117 can be formed within a relatively shallow trench. This relatively shallow trench can be patterned and etched into the top surface of the substrate 114 and can range, in one exemplary embodiment, in depth from approximately 50 nm to 5 microns in depth. The relatively shallow trench can further be filled with one or more isolation materials (e.g., silicon dioxide ($SiO_2$), silicon nitride (SiN), silicon oxynitride (SiON) or any other suitable isolation material or combination thereof).

The HBT 111 incorporates an emitter 120, a base 123 (including an intrinsic base 125 and an extrinsic base 126), and collector 129 formed inside the isolation structure 117. The collector 129 can include at least one dopant implant region. The dopant implant region can be doped with a second type dopant (e.g., an N-type dopant, such as arsenic, phosphorus, or antimony or any other suitable N-type dopant as discussed in greater detail below) so that it has a second type conductivity (e.g., N-type conductivity) at a relatively high conductivity level (e.g., so that the collector 129 is an N+ collector region). It should be understood that various different configurations for an in-substrate collector 129 are well known in the art (e.g., a single collector region adjacent to the top surface of the substrate, a buried collector region with a collector pedestal that extends from the buried collector region to the top surface of the substrate, etc.) and any of these configurations could be incorporated into the transistor embodiments disclosed herein. Thus, it should be understood that the methods disclosed herein could incorporate any suitable processes used to form a collector 129 within substrate 114.

The base 123 is above and immediately adjacent to the top surface of the substrate 114 and, particularly, aligned vertically above the collector 129. Those skilled in the art will recognize that, due to the epitaxial deposition process and the different crystalline structures, the base 123 may be relatively thick. The base 123 can include both an intrinsic base 125, which is at the center of the base 123 aligned above the center of the collector 129, and an extrinsic base 126, which is in the outer portion of the base 123 positioned laterally adjacent to and, more particularly, laterally surrounding the intrinsic base 125. A semiconductor layer can be in situ doped or subsequently implanted with a first type dopant (e.g., a P-type dopant, such as boron or any other suitable P-type dopant as discussed in greater detail below) such that the intrinsic base 125 has, for example, the first type conductivity at a relatively lower conductivity level (e.g., such that the intrinsic base 125 is a P-intrinsic base region). The outer portion of base 123 can be implanted with a first type dopant (e.g., a P-type dopant, such as boron or any other suitable P-type dopant as discussed in greater detail below) such that the extrinsic base 126 has the first type conductivity at a relatively higher conductivity level (e.g., such that the extrinsic base 126 is a P+ extrinsic base region).

The emitter 120 is above and aligned vertically above the base 123. The emitter 120 can be doped with a second type dopant (e.g., an N-type dopant, such as arsenic, phosphorus, or antimony or any other suitable N-type dopant as discussed in greater detail below) such that the emitter 120 has the second type conductivity (e.g., N-type conductivity) at a relatively high conductivity level (e.g., such that the emitter is an N+ emitter).

A silicide layer 132 may be deposited on the base 123. The HBT 111 further includes an emitter contact 135, a base contact 138, and a collector contact 141 formed through a dielectric layer 144. Each of the emitter contact 135, base contact 138, and collector contact 141 extend vertically through the dielectric layer 144. The dielectric layer 144 can be, for example, silicon oxide or any other suitable material (e.g., borophosphosilicate glass (BPSG), tetraethyl orthosilicate (TEOS), fluorinated tetraethyl orthosilicate (FTEOS), etc.). The contacts 135, 138, 141 can be tungsten (W) or copper (Cu). The components of the HBT may be formed using well known microfabrication techniques, as would be known to one of ordinary skill in the art, the details of which have been omitted from this specification in order to allow the reader to focus on the salient aspects of the disclosed structures.

Figure 2:
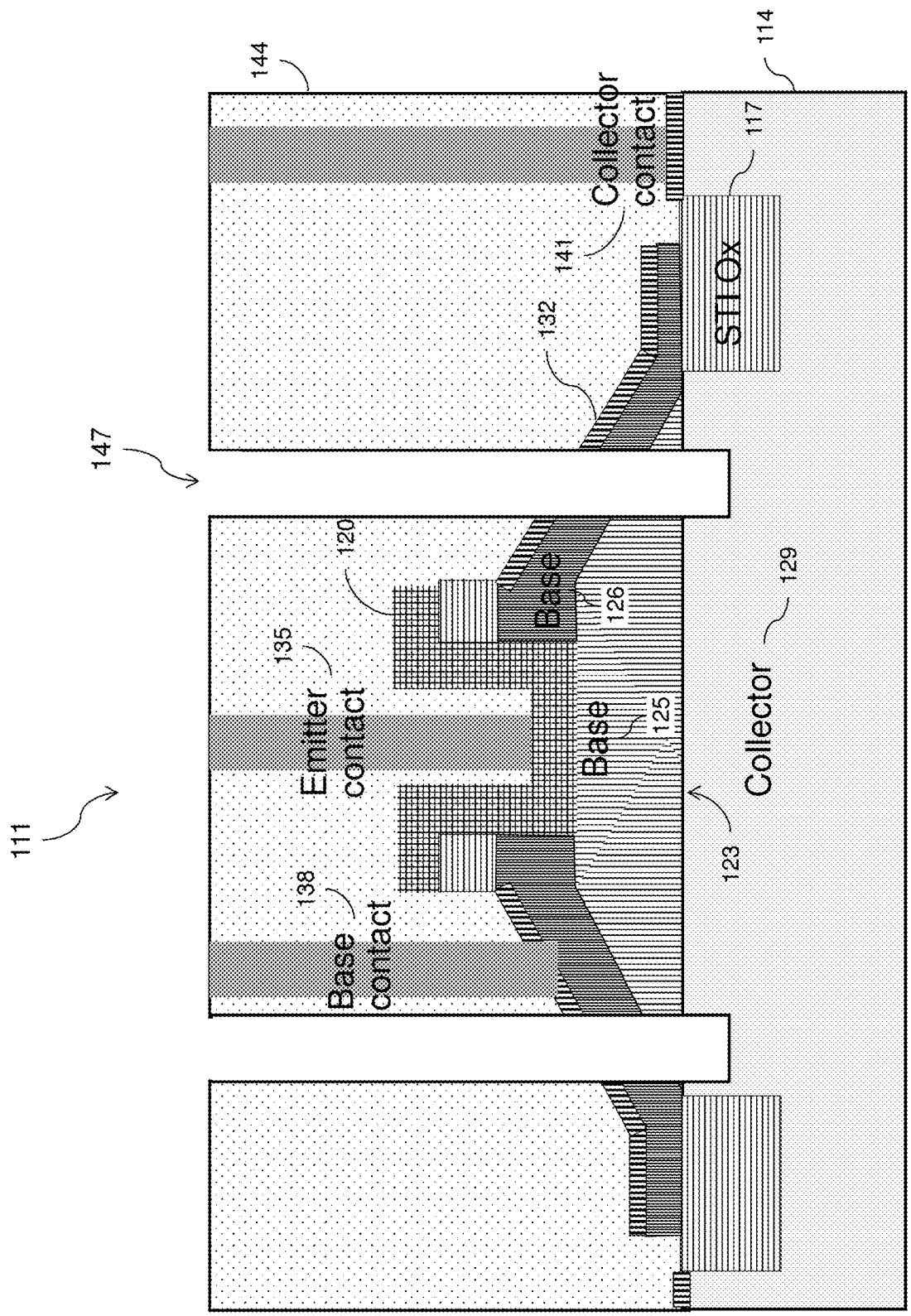

Referring to FIG. 2, a trench 147 may be patterned and etched through the dielectric layer 144 and extended at least partially into the base 123. In some cases, such as shown in FIG. 2, the trench 147 may extend all the way through the base 123 and at least partially into the collector 129. According to devices and methods herein, the trench 147 may be formed by etching the dielectric layer 144, using an appropriate photoresist (not shown), as would by known by one skilled in the relevant art. One or more conventional etch processes, such as a reactive ion etch (RIE), may be used to form the trench 147. For example, a reactive ion etch (RIE) process may be performed for etching each of the dielectric layer 144 and a portion of the base 123, with each RIE process being tailored to the material of the feature being etched.

Any suitable etch may be used to form the trench 147, such as a selective RIE process. In one non-limiting example, the trench 147 may have a width of about 200 nm. It is contemplated that the present disclosure is not limited to the exemplary dimensions described herein, however, and any suitable width and depth may be used with the trench 147 as appropriate. Note the trench 147 may be formed between the isolation structure 117 and the HBT 111. Alternatively, the isolation structure 117 may be formed between the trench 147 and the HBT 111. Still further, the trench 147 may be formed straddling the isolation structure 117.

Figure 3:
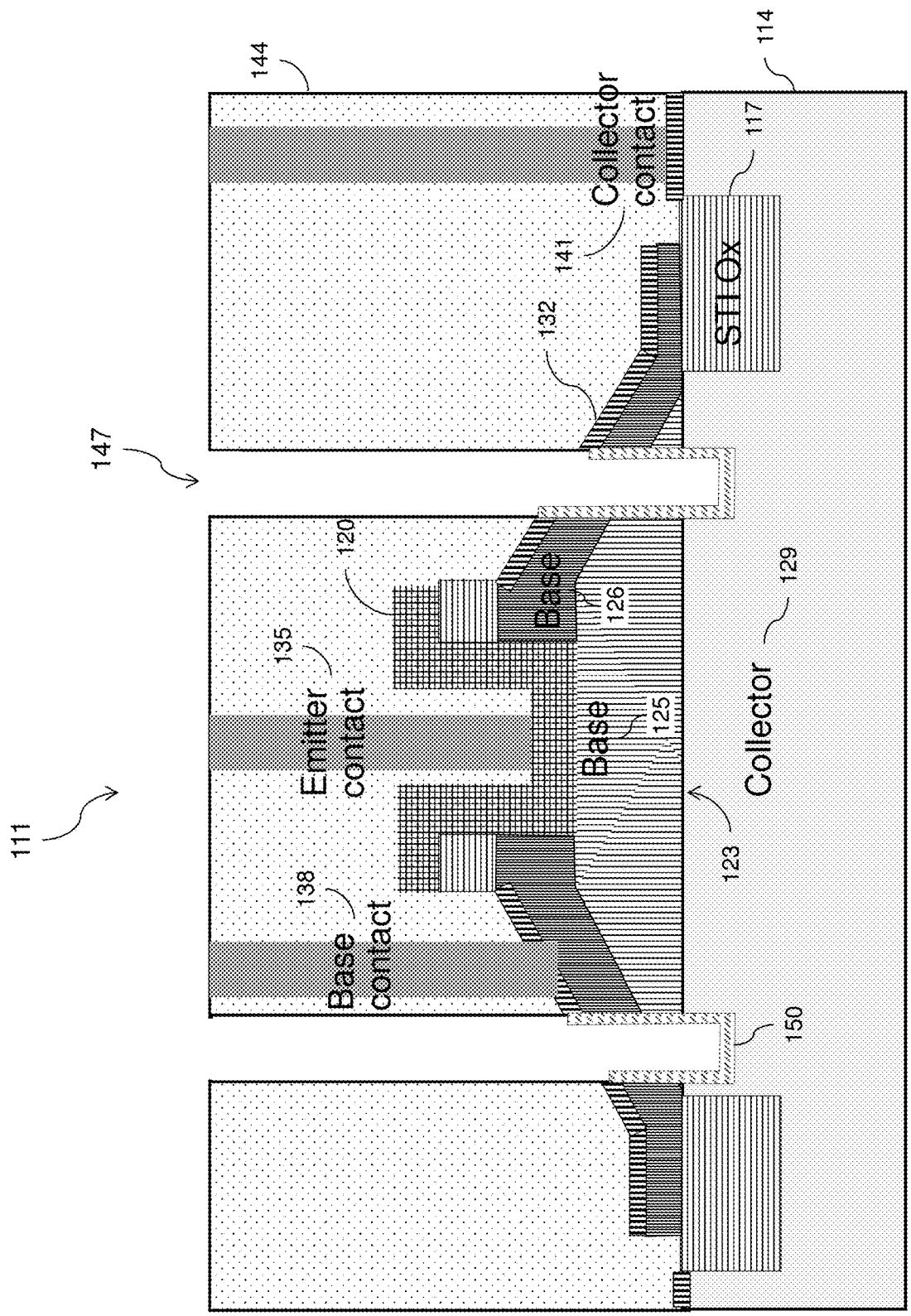
Figure 3A:
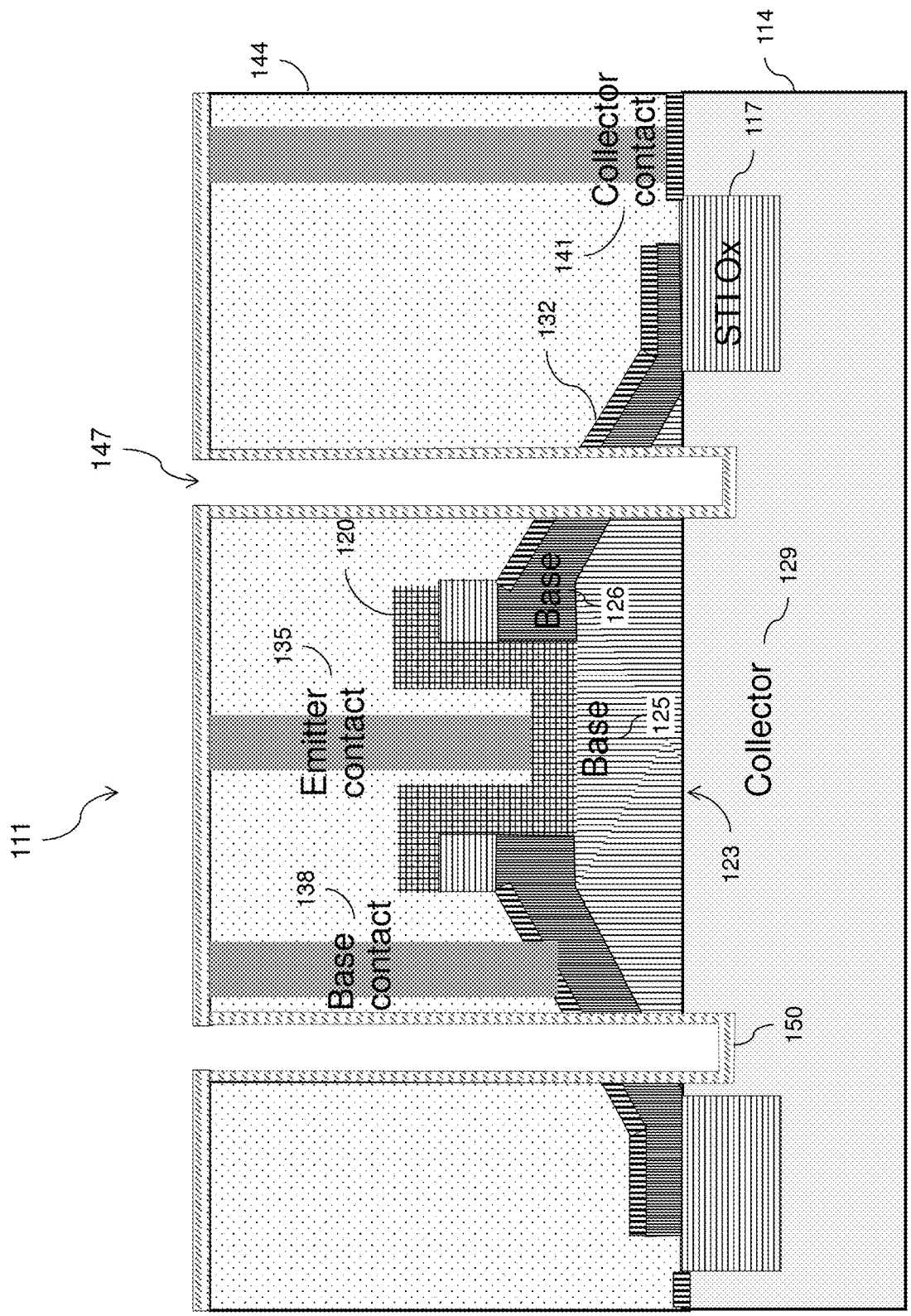
Figure 3B:
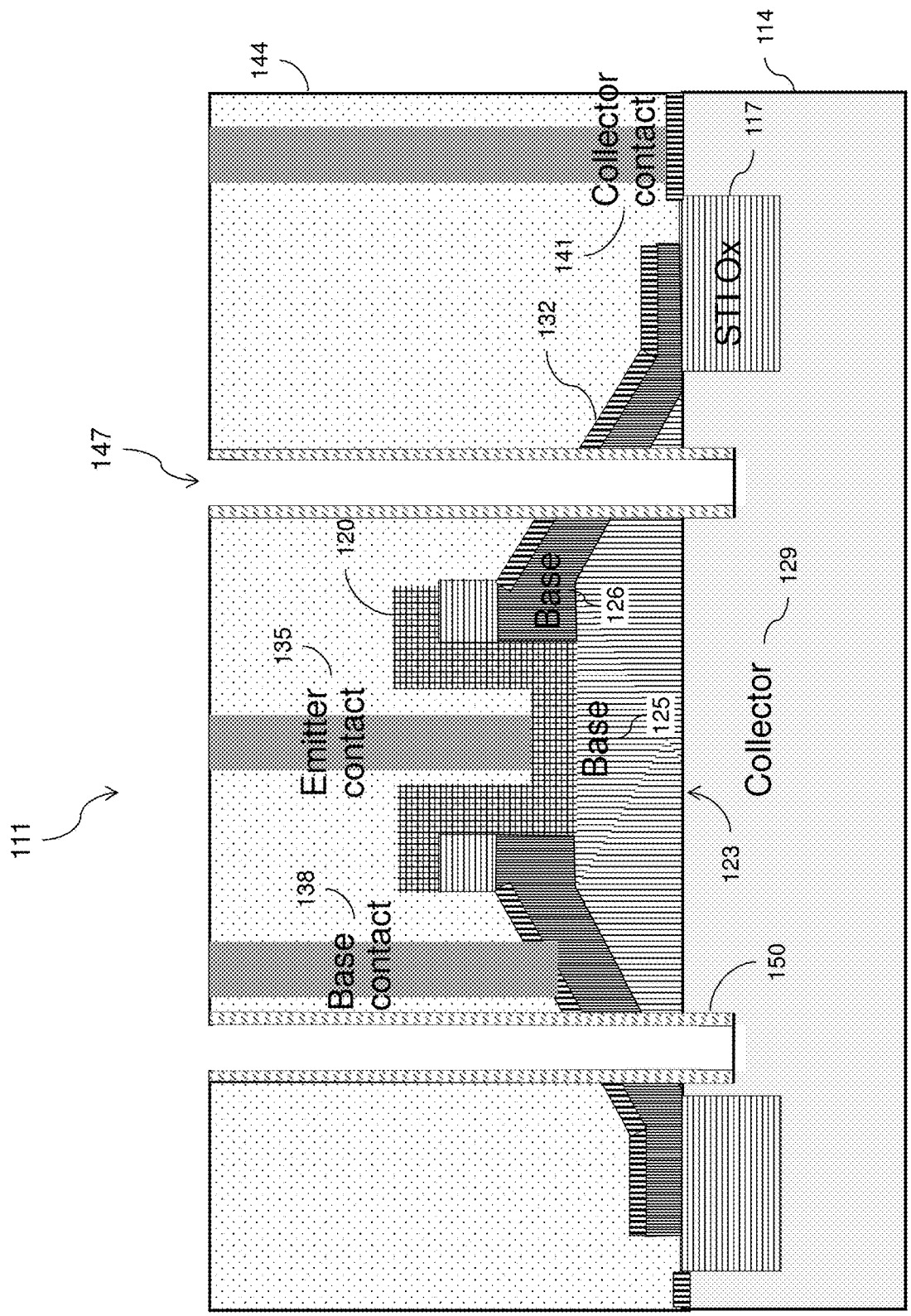

As shown in FIG. 3, an oxidation spacer 150 may be formed to line sidewalls of at least a portion of the trench 147. The oxidation spacer 150 may have a thickness of approximately 30 nm formed on the exposed Si and SiGe using a thermal or selective oxidation process as shown in FIG. 3. Alternatively, as shown in FIG. 3a, a vapor deposition process, such as chemical vapor deposition or atomic layer deposition may be used, which would coat both the exposed Si and SiGe of the substrate 114 but also the sidewalls and bottoms of the trench 147 formed in the dielectric layer 144. The oxidation spacer 150 may be either as deposited (as shown in FIG. 3a) or after an etch back to form spacers (as shown in FIG. 3b). The subsequent text is described with reference to the embodiment show in FIG. 3; however, it is contemplated that any of the embodiments shown in FIGS. 3, 3a, and 3b may be used.

Figure 4:
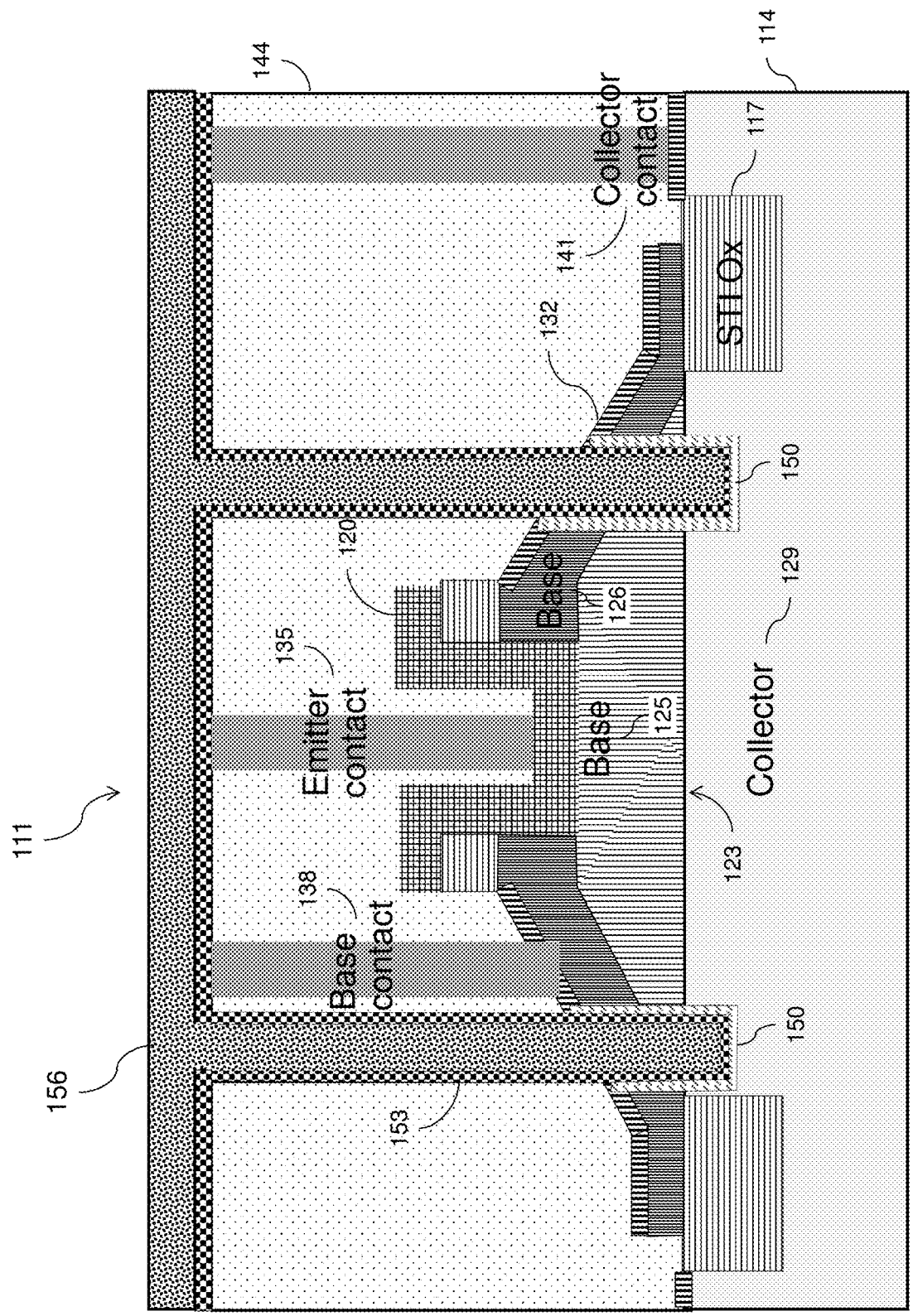

Referring to FIG. 4, a titanium liner 153 may be formed on the exposed surfaces of the trench 147, including the sidewalls and bottom. The titanium liner 153 may be formed using conventional semiconductor processes. For example, the titanium liner 153 may be formed using an atomic layer deposition technique. Alternatively, a conformal deposition process, such as chemical vapor deposition (CVD) or physical vapor deposition (PVD) may be used. In some non-limiting examples, the titanium liner 153 may have a thickness of about 20 nm, although other thicknesses may be used.

As further depicted in FIG. 4, an aluminum layer 156 may be formed on the top surface of the dielectric layer 144 and in the trench 147 on the titanium liner 153. According to devices and methods herein, the aluminum layer 156 may be formed using conventional semiconductor processes. For example, the aluminum layer 156 may be formed using an atomic layer deposition technique. Alternatively, a conformal deposition process, such as chemical vapor deposition (CVD) may be used. In some non-limiting examples, the aluminum layer 156 may have a thickness of about 80 nm, although other thicknesses may be used. In one exemplary embodiment, the thickness ratio of titanium liner 153 to aluminum layer 156 is approximately 1:3, since the subsequent anneal converts the aluminum and titanium to compressive titanium triluminide (TiAl3).

Figure 5:
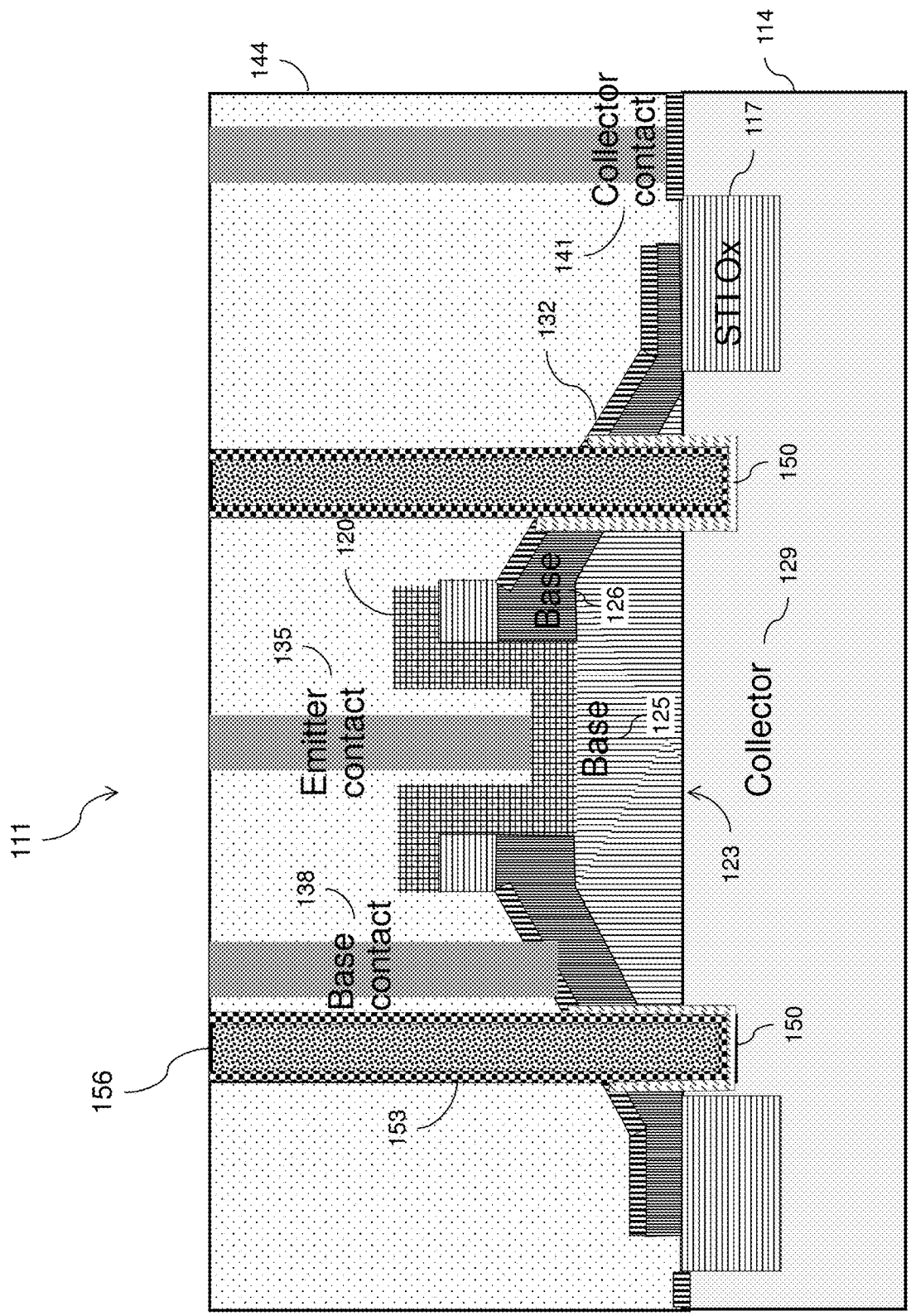

The deposition of the aluminum layer 156 may result in the formation of excess material on the upper surface of the dielectric layer 144. As shown in FIG. 5, the excess material may be removed using a planarization process. Any suitable planarization process may be used, such as an etch or CMP process. In particular, the structure may be planarized to remove the excess material from the top surface of the dielectric layer 144. The planarization stops at the top of the dielectric layer 144. After this step, conventional processing can be used to form contacts and interconnects. Note: it is contemplated that the emitter contact 135, base contact 138, and collector contact 141 can be formed after formation and filling of the trench 147.

Figure 6:
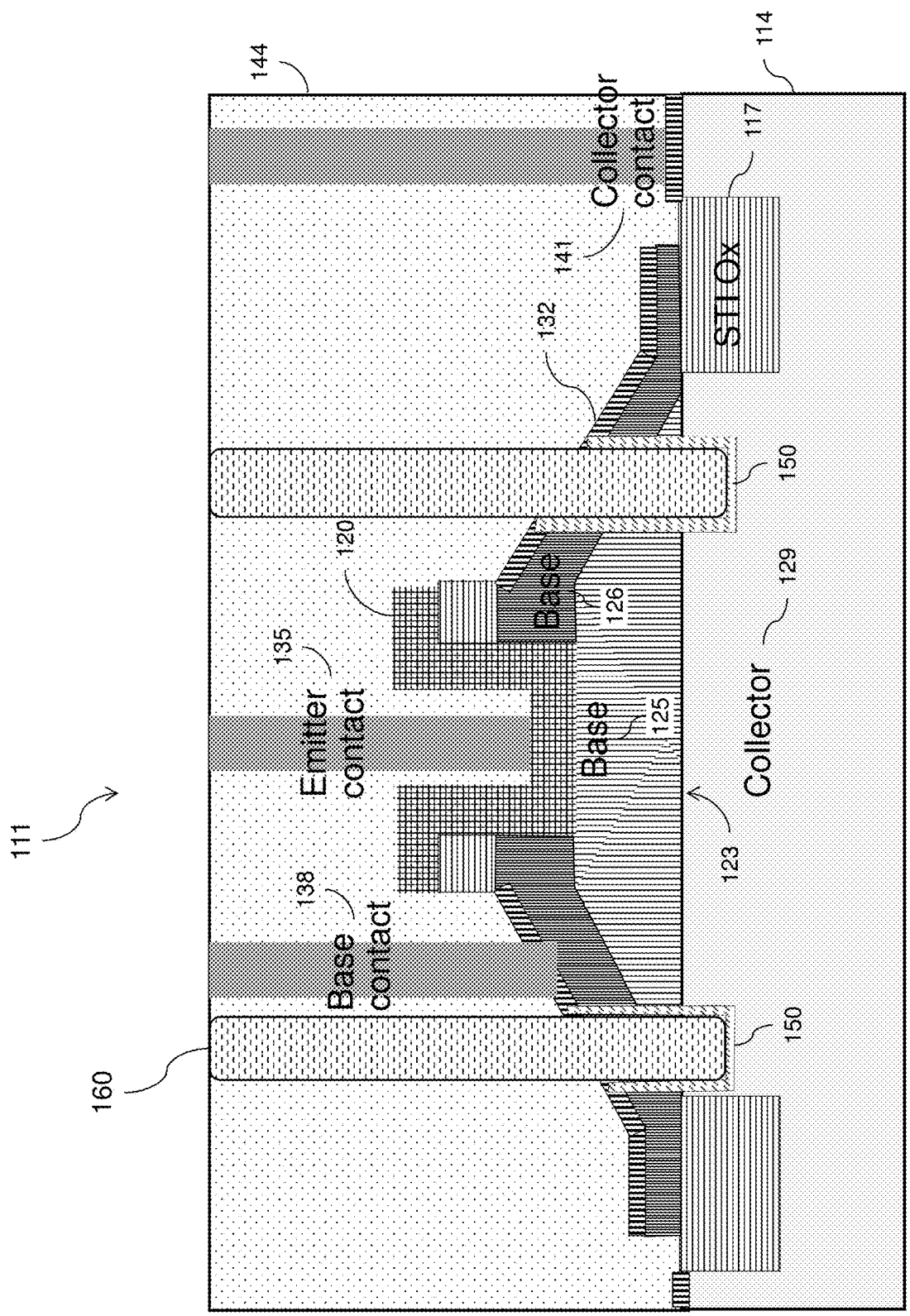

In FIG. 6, the HBT 111 undergoes an annealing process. The annealing converts the titanium liner 153 and aluminum layer 156 into a core 160. The core 160 is made of TiAl3, resulting from the reaction of Ti and Al. The HBT 111 may be annealed at approximately 400° C. for approximately 20 minutes to form TiAl3 as the core 160. It should be recognized that the annealing process might only partially react the titanium (Ti) and aluminum (Al) that has been deposited in the trench 147. For example, the core 160 may contain unreacted Ti or unreacted Al based on (1) the time and temperature of the annealing process and/or (2) the relative concentration/thickness of the titanium liner 153 and the aluminum layer 156. In some embodiments, the core 160 may be formed by deposition of titanium nitride (TiN) or other films that are compressive as deposited.

In some embodiments, the aluminum layer may be deposited first to coat the sidewalls of the trench 147. For example, a 150 nm layer of aluminum may be deposited using atomic layer deposition (ALD) or other technique, as appropriate. Then, a 50 nm layer of titanium may be deposited by ALD to pinch off the trench 147. The layers may be annealed at approximately 400° C. to form TiAl3. In some cases, one or more titanium liners 153 can be alternately applied with one or more aluminum layers 156 before the annealing process. In another option, the aluminum layer 156 can be nitridized using a 400° C. nitrogen plasma to pinch off the trench 147.

Note: the aluminum in the trench has an approximate stress of 373 MPa tensile and the titanium in the trench has an approximate stress of 293 MPa tensile. The post-anneal reacted TiAl$_3$ inside the trench 147 has a residual stress of approximately −390 MPa compressive. In addition, the post-anneal core 160 inside the trench may contain unreacted titanium or unreacted aluminum that is left over based on the annealing process.

According to devices and methods herein, the HBT 111 may be a PNP or NPN transistor array. (Note: lines and connectors are not shown in the views in order to avoid clutter.) One or a number of HBTs connected to other devices in an integrated circuit (IC) chip, e.g., on a BiCMOS IC chip. In particular, the HBT 111 may be any suitable HBT, such as a self-aligned SiGe HBT. To increase the base mobility of a PNP transistor, a tensile material would be deposited in the trench 147. If both NPN and PNP transistors were formed on the same wafer and both need to have increased base mobility, then compressive trench fill material would be used for the NPN transistor and tensile trench fill material would be used for the PNP transistor.

Figure 7:
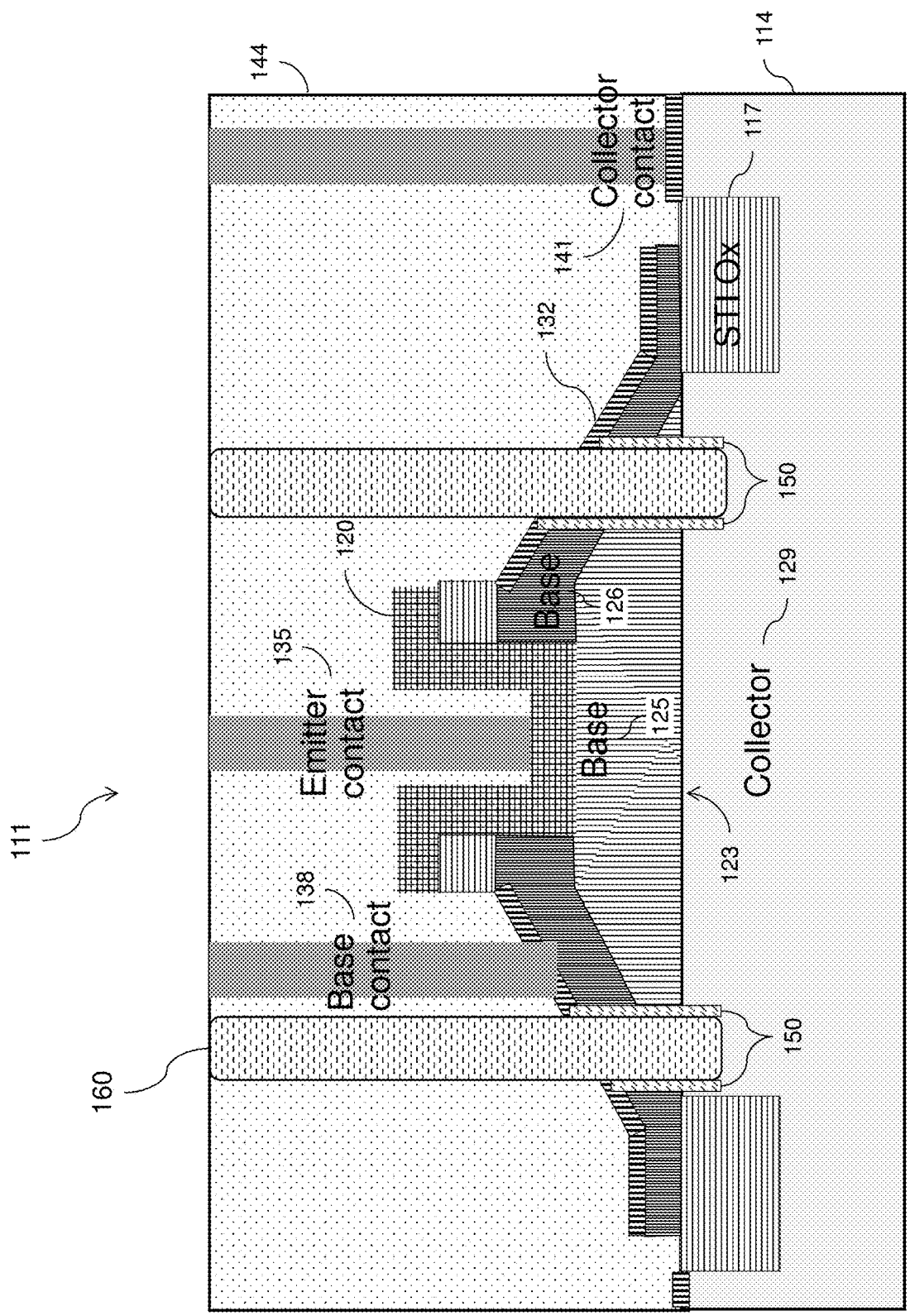
FIG. 7 is a cross-section diagram illustrating a partially completed IC structure formed according to another embodiment of the devices and methods herein.

FIG. 7 shows an additional optional step in forming the core 160. The bottom of the oxidation spacer 150 may be etched prior to deposition of the titanium liner 153 and aluminum layer 156, similar to the embodiment shown in FIG. 3b. This allows the core 160 to be connected to collector contact 141.

Figure 8:
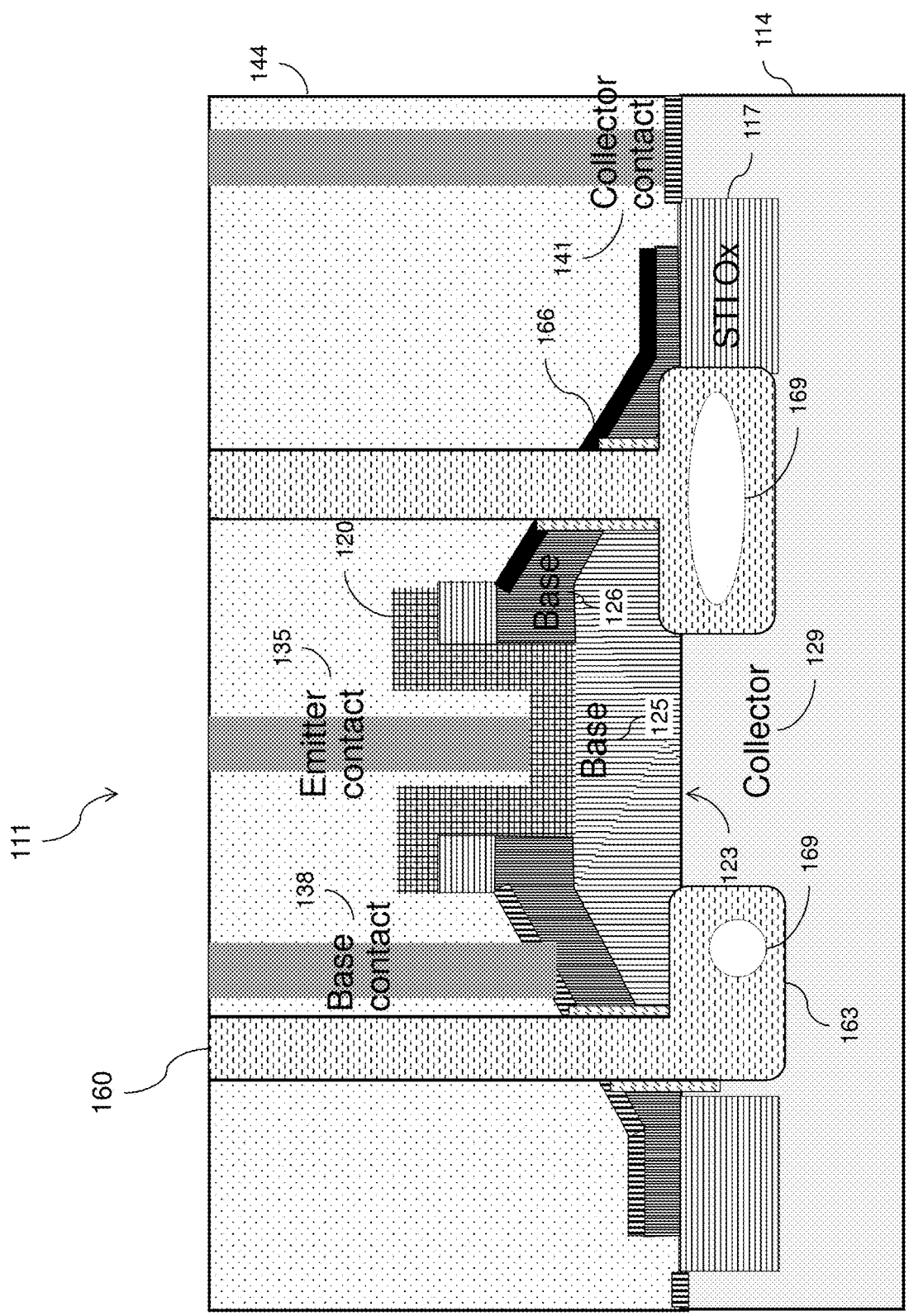
FIGS. 8 and 9 are cross-section diagrams illustrating a partially completed IC structure formed according to another embodiment of the devices and methods herein.

In FIG. 8, after the oxidation spacer 150 has been etched, an undercut area 163 may be formed below the base 123, prior to deposition of the titanium liner 153 and aluminum layer 156. The undercut area 163 may be formed using xenon difluoride (XeF2), sulfur hexafluoride (SF6), potassium hydroxide (KOH), or similar silicon etches. In some cases, a nitride layer 166 may be deposited on the base in place of the silicide layer 132. In some cases, the undercut area 163 can also have an airgap 169 enclosed in the core 160.

Figure 9:
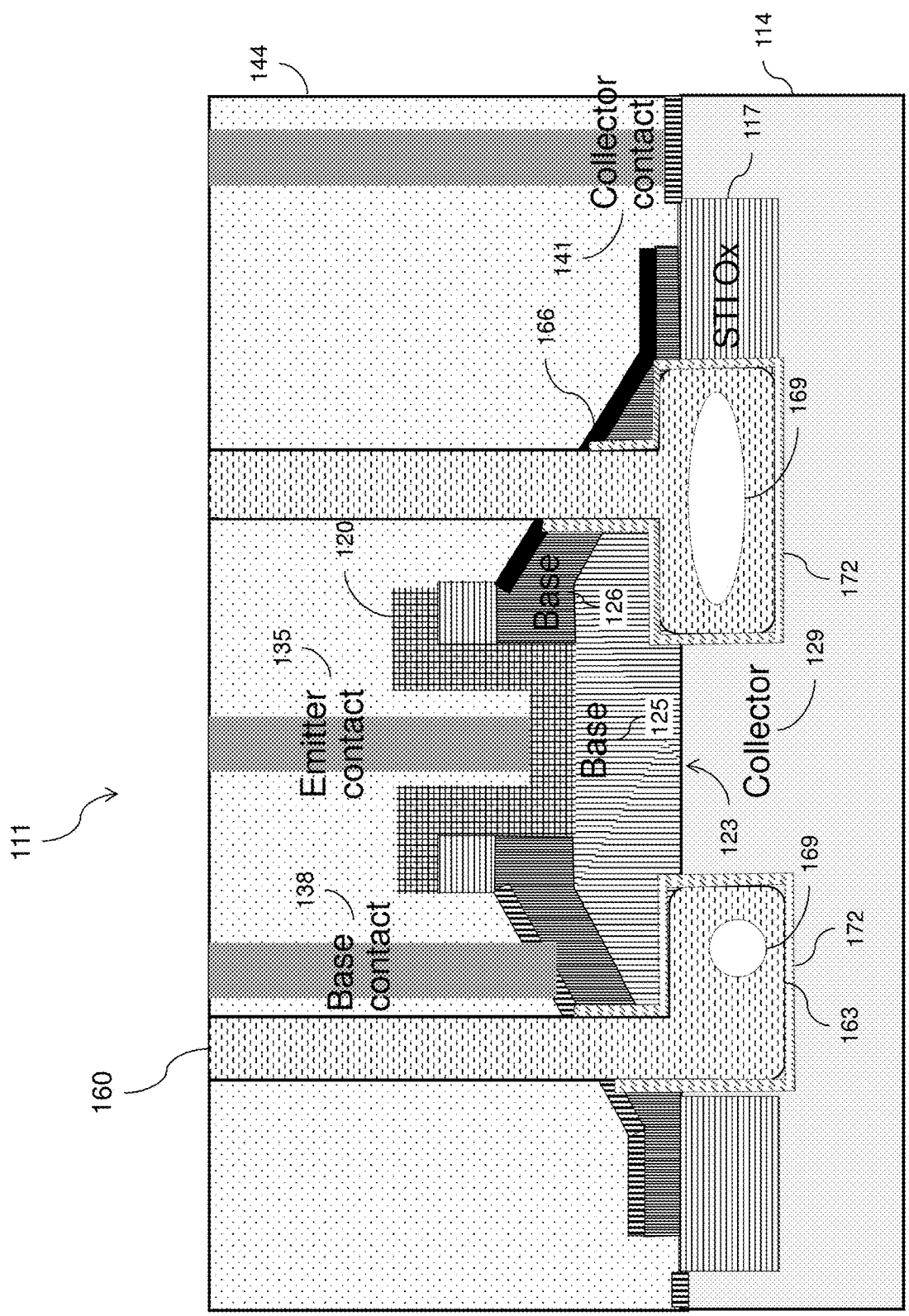

In FIG. 9, the bottom of the oxidation spacer 150 may be etched and the undercut area 163 may be formed using xenon difluoride ($XeF_2$) or other chemicals as discussed above. Then, a passivation layer 172 may be formed on the undercut area 163 prior to deposition of the titanium liner 153 and aluminum layer 156. Then the structure is annealed to convert the titanium liner 153 and aluminum layer 156 into the core 160 ($TiAl_3$ or TiN).

Figure 10:
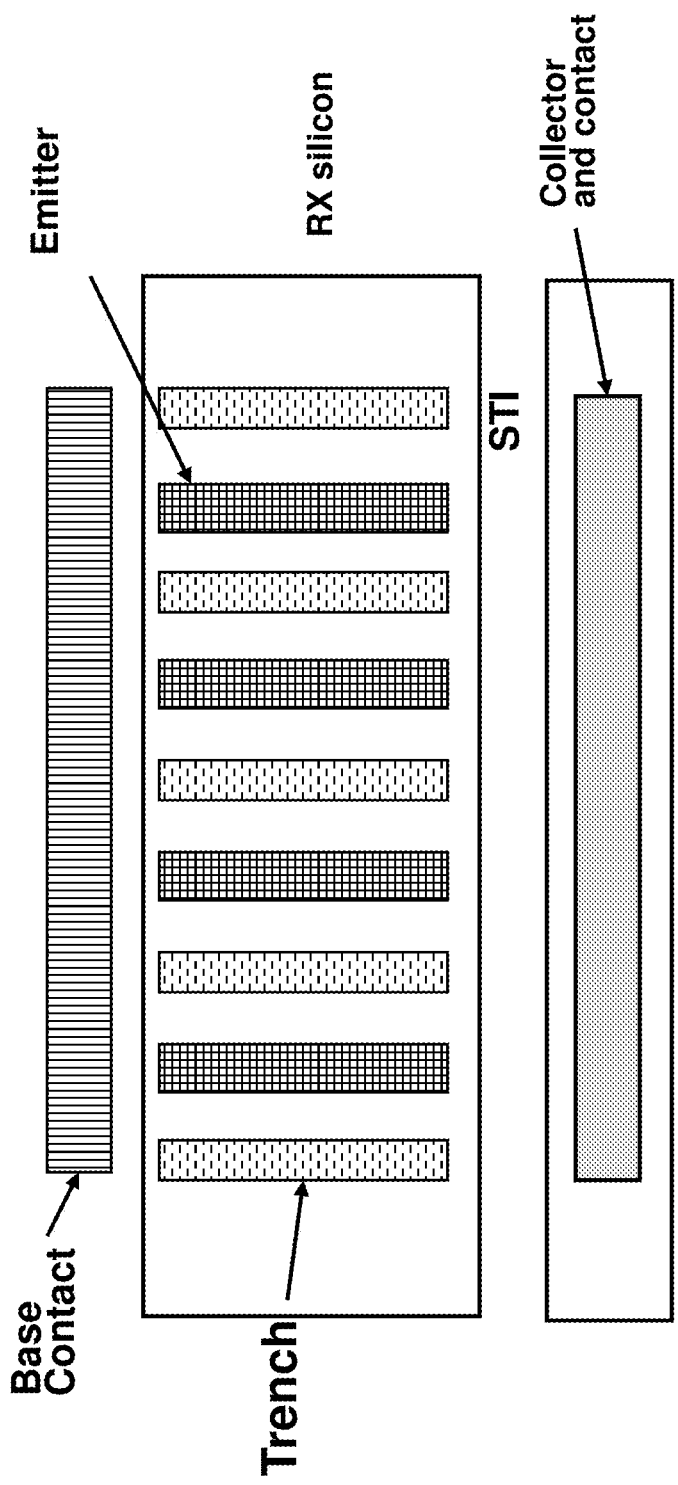
FIGS. 10-14 show a plan view of NPN layouts with trenches according to devices and methods herein.
Figure 11:
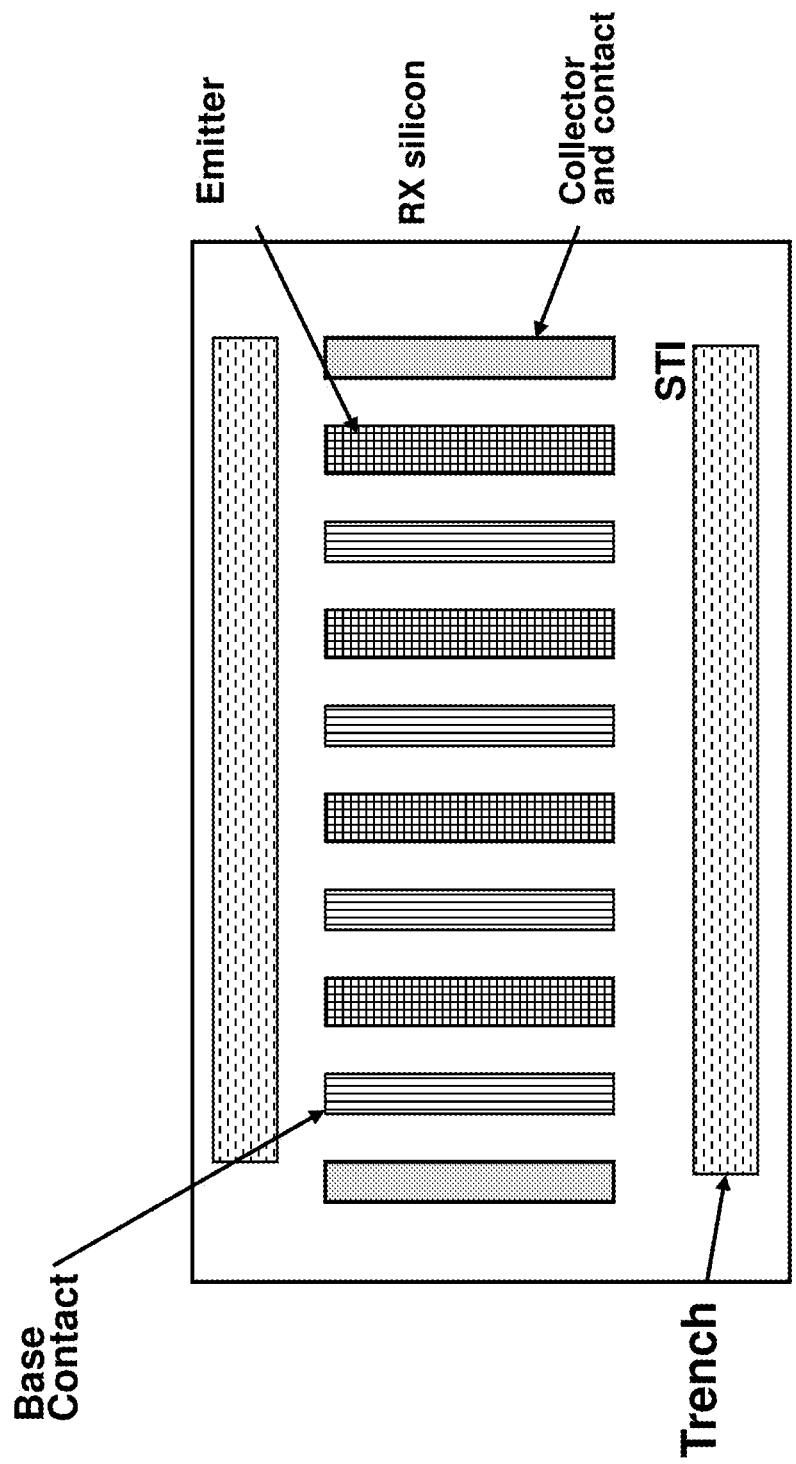

FIGS. 10-14 show a plan view or top view of NPN layouts with trenches according to devices and methods herein. FIG. 10 shows an orthogonal collector-emitter-base (OCEB) layout structure with trenches on each side of each of the emitters. FIG. 11 shows a nominal multiple emitter transistor structure with a trench on each end. The structures in FIGS. 10 and 11 use short emitter lengths to maintain $f_{max}$. Such structures may be suitable for a low noise amplifier (LNA) or high performance silicon germanium (SiGe).

Figure 13:
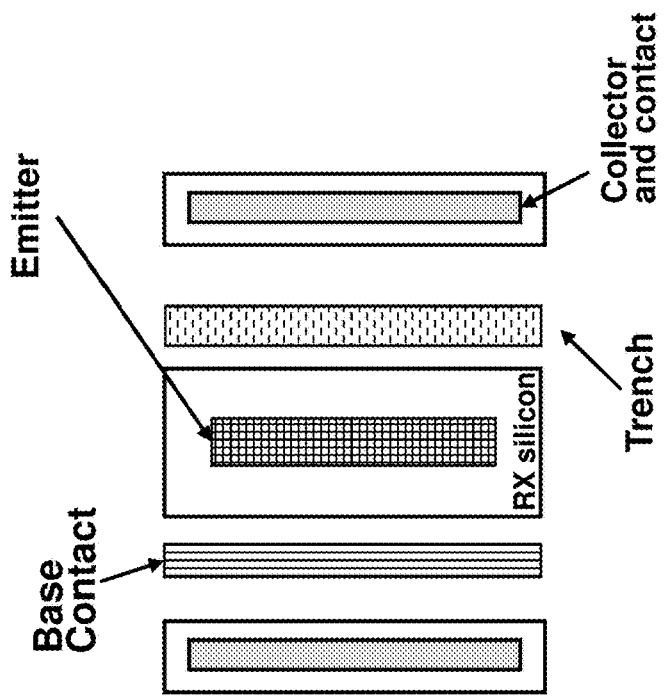
Figure 12:
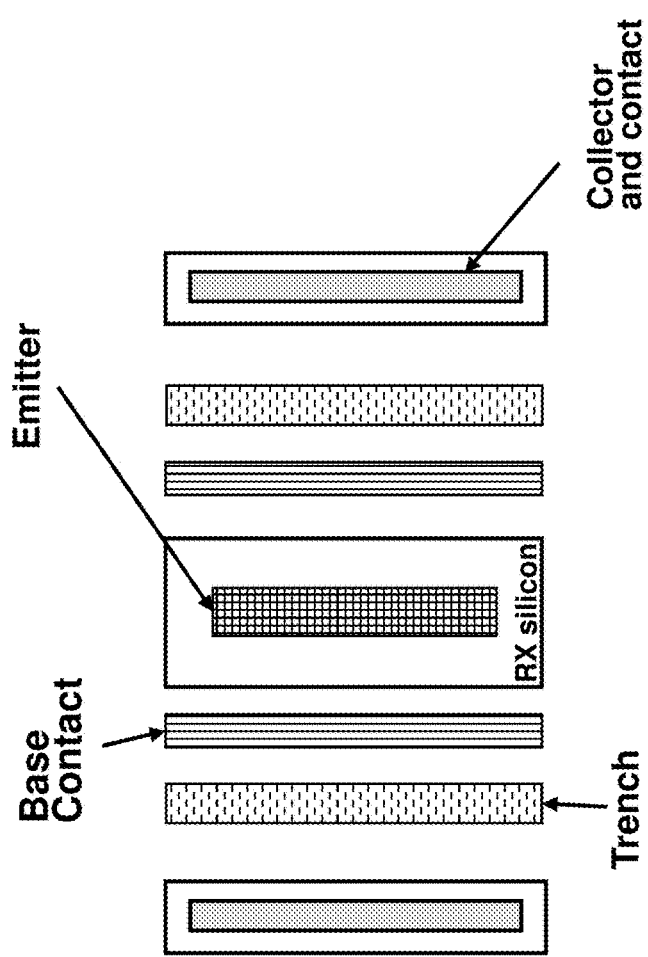
Figure 14:
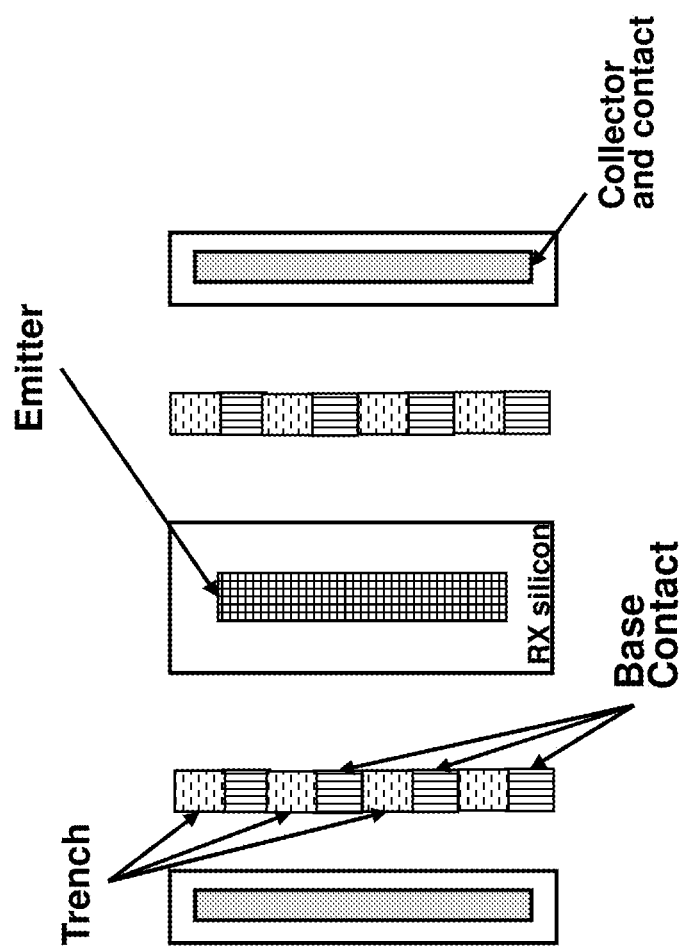

FIGS. 12 and 13 show similar configurations of the transistor. In FIG. 12, the trench layout is symmetric around the emitter. In FIG. 13, the trench layout is asymmetric. FIG. 14 shows a symmetric layout with the base and trench interdigitated. These layouts allow for the trench 147 to be formed without degrading the resistance of the wiring used to contact the base, emitter, and collector. If, for example, the trench 147 were to be placed between the base contact and the emitter (not shown), the base resistance would be higher or infinitely higher, due to reduced or no electrical current path between the base and emitter.

Figure 15:
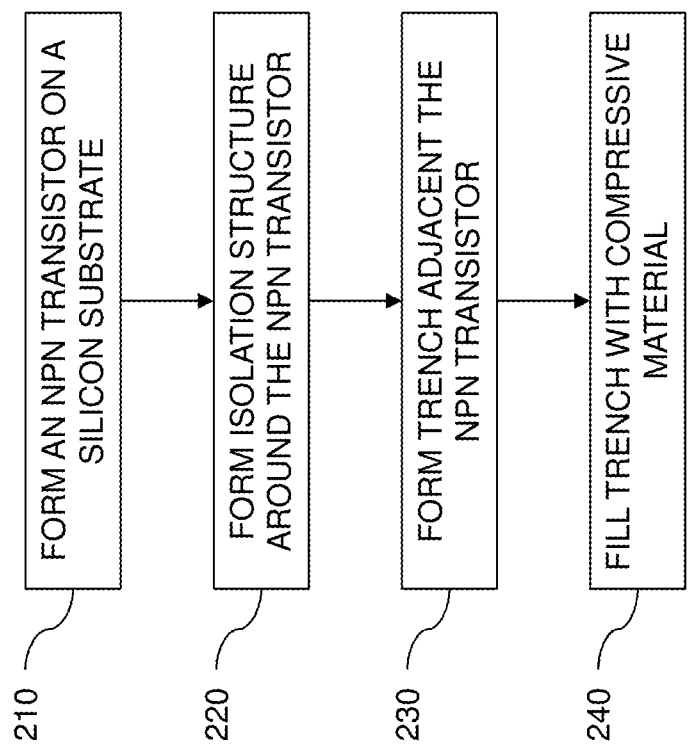
FIG. 15 is a flow diagram illustrating devices and methods herein.

FIG. 15 is a flow diagram illustrating the processing flow of an exemplary method of fabricating a heterojunction bipolar transistor (HBT) having stress material in trenches around the emitter for improved mobility, according to devices and methods herein. At 210, an NPN transistor is formed on a silicon substrate. The NPN transistor includes a collector region, a base region formed on the collector region, and an emitter region formed on the base region. An isolation structure is formed in the silicon substrate around the NPN transistor, at 220. The isolation structure may be a shallow trench isolation (STI). A trench is formed in the silicon substrate and positioned laterally adjacent the NPN transistor, at 230. The trench is formed at least partially into the base region. The trench is then filled with compressive material to improve carrier mobility in the base and collector region, at 240.

It is contemplated that the methods described herein can be used in fabricating a Silicon Germanium (SiGe) heterojunction bipolar device or any complementary metal oxide semiconductor (CMOS) device.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

Aspects of the present disclosure are described herein with reference to flowchart illustrations and/or block diagrams of methods, apparatus (systems), and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It should be understood that the terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
    a substrate;
    an NPN transistor formed in the substrate, the NPN transistor comprising:
        a collector region,
        a base region formed on the collector region, and
        an emitter region formed on the base region;
    an isolation structure formed in the substrate around the NPN transistor, the isolation structure containing a dielectric; and
    a trench formed in the substrate, the trench being positioned laterally adjacent to the emitter region and the base region, the trench extending from above the top of the emitter region, through the base region, and at least partially into the collector region, wherein the trench undercuts at least a portion of the base region, and wherein the trench is filled with a core connected to the collector region, the core comprising a compressive material.

2. The semiconductor device according to claim 1, wherein the trench is positioned between the isolation structure and the NPN transistor or the isolation structure is positioned between the trench and the NPN transistor.

3. The semiconductor device according to claim 1, further comprising an airgap enclosed in a portion of the core that undercuts at least a portion of the base region.

4. The semiconductor device according to claim 1, wherein the isolation structure comprises a shallow trench isolation (STI) structure.

5. A heterojunction bipolar transistor (HBT) structure comprising:
    an emitter;
    a base comprising an extrinsic base and an intrinsic base;
    a collector;
    a shallow trench isolation (STI) structure formed around the emitter, the base, and the collector;
    a trench positioned laterally adjacent to the emitter and the base, the trench extending from above the top of the emitter, through the base, and at least partially into the collector, wherein the trench undercuts at least a portion of the intrinsic base; and
    a core connected to the collector, the core comprising a compressive material filling the trench,
    the HBT comprising an NPN type transistor.

6. The HBT structure according to claim 5, the core comprising titanium triluminide (TiAl$_3$) or titanium nitride (TiN).

7. The HBT structure according to claim 5, wherein the emitter, the base, and the collector comprise an active device, and the trench is positioned between the STI structure and the active device or the STI structure is positioned between the trench and the active device.

8. The HBT structure according to claim 5, further comprising an airgap enclosed in a portion of the core that undercuts at least a portion of the intrinsic base.

9. A transistor structure, comprising:
    a substrate;
    a collector formed in the substrate;
    a base formed on the collector, the base comprising an extrinsic base and an intrinsic base;
    an emitter formed on the base;
    an isolation structure formed around the emitter, the base, and the collector, the isolation structure containing a dielectric;
    a trench positioned laterally adjacent to the emitter and the base, the trench extending from above the top of the emitter, through the base, and at least partially into the collector, wherein the trench undercuts at least a portion of the intrinsic base;
    a core connected to the collector, the core comprising a compressive material filling the trench; and
    an airgap enclosed in a portion of the core that undercuts at least a portion of the intrinsic base.

10. The transistor structure according to claim 9, wherein the isolation structure formed around the emitter, base, and collector comprises a shallow trench isolation (STI) structure.

11. The transistor structure according to claim 9, the core comprising titanium triluminide (TiAl$_3$) or titanium nitride (TiN).

12. The transistor structure according to claim 9, wherein the emitter, the base, and the collector comprise an active device and wherein the trench is positioned between the isolation structure and the active device or the isolation structure is positioned between the trench and the active device.

13. The transistor structure according to claim 12, wherein the active device comprises a heterojunction bipolar transistor (HBT) or a bipolar junction transistor (BJT).

14. The semiconductor device according to claim 1, wherein the core is formed by depositing alternating layers of materials in the trench, which are deposited in a tensile condition and become compressive with reaction of the layers of materials in the trench.

15. The semiconductor device according to claim 14, the layers of materials in the trench comprising titanium (Ti) and aluminum (Al) films, which react to form titanium triluminide ($TiAl_3$).

16. The HBT structure according to claim 9, wherein the core is formed by depositing alternating layers of materials in the trench, which are deposited in a tensile condition and become compressive with reaction of the layers of materials in the trench.

17. The HBT structure according to claim 16, the layers of materials in the trench comprising titanium (Ti) and aluminum (Al) films, which react to form titanium triluminide ($TiAl_3$).

18. The transistor structure according to claim 5, wherein the core is formed by depositing alternating layers of materials in the trench, which are deposited in a tensile condition and become compressive with reaction of the layers of materials in the trench.

19. The transistor structure according to claim 18, the layers of materials in the trench comprising titanium (Ti) and aluminum (Al) films, which react to form titanium triluminide ($TiAl_3$).

* * * * *